US012640224B2

(12) United States Patent
Bamdhamravuri et al.

(10) Patent No.: US 12,640,224 B2
(45) Date of Patent: May 26, 2026

(54) SIGNAL SKEW CORRECTION IN INTEGRATED CIRCUIT MEMORY DEVICES

(71) Applicant: Rambus Inc., San Jose, CA (US)

(72) Inventors: Srinivas Satish Babu Bamdhamravuri, Newbury Park, CA (US); Panduka Wijetunga, Thousand Oaks, CA (US)

(73) Assignee: Rambus Inc., San Jose, CA (US)

( * ) Notice: Subject to any disclaimer, the term of this patent is extended or adjusted under 35 U.S.C. 154(b) by 391 days.

(21) Appl. No.: 18/266,782

(22) PCT Filed: Dec. 8, 2021

(86) PCT No.: PCT/US2021/062467
§ 371 (c)(1),
(2) Date: Jun. 12, 2023

(87) PCT Pub. No.: WO2022/132538
PCT Pub. Date: Jun. 23, 2022

(65) Prior Publication Data
US 2024/0055068 A1 Feb. 15, 2024

Related U.S. Application Data

(60) Provisional application No. 63/160,393, filed on Mar. 12, 2021, provisional application No. 63/125,857, filed on Dec. 15, 2020.

(51) Int. Cl.
*G11C 7/22* (2006.01)
*G11C 8/18* (2006.01)
(Continued)

(52) U.S. Cl.
CPC ........ *G11C 29/50012* (2013.01); *G11C 7/222* (2013.01); *G11C 8/18* (2013.01);
(Continued)

(58) Field of Classification Search
CPC ..... G11C 29/50012; G11C 7/222; G11C 8/18; G11C 11/4063; G11C 29/56004;
(Continued)

(56) References Cited

U.S. PATENT DOCUMENTS 7,042,914 B2 5/2006 Zerbe et al.
7,626,884 B2 12/2009 Cox et al.
(Continued)

FOREIGN PATENT DOCUMENTS

JP 2012208936 A 10/2012

OTHER PUBLICATIONS

JEDEC Standard, "GDDR5 Sgram", JESD212A, JEDEC Solid State Technology Association, Apr. 2013. 148 Pages.
(Continued)

*Primary Examiner* — Jay W. Radke
(74) *Attorney, Agent, or Firm* — Lowenstein Sandler LLP

(57) ABSTRACT

Technologies for signal skew correction in integrated circuit memory devices are described. An integrated circuit memory device includes a first interface to receive command/address (CA) signals and a clock signal, a data interface, and a mode register. During a CA bus loopback mode, the first interface receives a pattern of CA signals and the clock signal and the data interface outputs the pattern of CA signals. During the CA bus loopback mode, the mode register can be programmed with a value representative of a timing offset between the clock signal and a sampling point for the first interface.

7 Claims, 13 Drawing Sheets

(51) Int. Cl.
    *G11C 11/4063*      (2006.01)
    *G11C 29/50*      (2006.01)
    *G11C 29/56*      (2006.01)

(52) U.S. Cl.
    CPC .... *G11C 11/4063* (2013.01); *G11C 29/56004* (2013.01); *G11C 29/56012* (2013.01); *G11C 2029/5602* (2013.01)

(58) Field of Classification Search
    CPC ...... G11C 29/56012; G11C 2029/5602; G11C 2207/2254; G11C 29/023; G11C 29/028; G06F 13/1689
    See application file for complete search history.

(56)            References Cited

U.S. PATENT DOCUMENTS

| | | | |
|---|---|---|---|
| 9,754,650 | B2 | 9/2017 | Kim et al. |
| 11,675,716 | B2 * | 6/2023 | Mozak .................. G11C 29/74 |
| | | | 711/154 |
| 2006/0161745 | A1 | 7/2006 | Lee et al. |
| 2006/0282722 | A1 | 12/2006 | Co et al. |
| 2012/0250433 | A1 | 10/2012 | Jeon |
| 2014/0089752 | A1 | 3/2014 | Nelson et al. |
| 2016/0188423 | A1 | 6/2016 | Meaney et al. |
| 2018/0294044 | A1 | 10/2018 | Fu et al. |
| 2019/0034365 | A1 * | 1/2019 | Lovelace ........... G06F 13/1684 |
| 2020/0110716 | A1 * | 4/2020 | Mozak ................. G06F 18/214 |
| 2020/0126609 | A1 | 4/2020 | Kim et al. |

OTHER PUBLICATIONS

JEDEC Standard, "Graphics Double Data Rate (GDDR6) SGRAM Standard", JESD250, Jedec Solid State Technology Association, Jul. 2017. 190 pages.

JEDEC Standard, "Low Power Double Data Rate 4 (LPDDR4)", JESD209-4C (Revision of JESD209-4B, Feb. 2017), JEDEC Solid State Technology Association, Jan. 2020. 357 Pages.

JEDEC Standard, "Low Power Double Data Rate 5 (LPDDR5)", JESD209-5A (Revision of JESD209-5, Dec. 2018), JEDEC Solid State Technology Association, Jan. 2020. 546 pages.

Notification of Transmittal of the International Search Report and the Written Opinion of the International Searching Authority, or the Declaration with Mail Date Feb. 28, 2022 re: Int'l Appln. No. PCT/US2021/062467. 17 pages.

EP Extended European Search Report with Mail Date Oct. 10, 2024 re: EP Appln. No. 21907502.5. 13 pages.

JP Office Action with Mail Date Oct. 1, 2025 re: JP Appln. No. 2023-535969. 9 pages.

* cited by examiner

CSn
702

CK
704

CA[13:0]
706

710 — For hold

708 — For setup setup stress hold stress

Qn=0

Qn=63

Qn=0

CATM

| DRAM | Left | Right | Avg | center | (1step=5.58 ps) Offset | (offset*1step) delay0 (ps) | |
|---|---|---|---|---|---|---|---|
| u14 | 18 | 25 | 21.5 | 31 | 9.5 | 53 | 724 |
| u13 | 19 | 26 | 22.5 | 31 | 8.5 | 47.4 | 722 |
| u12 | 20 | 27 | 23.5 | 31 | 7.5 | 41.9 | 720 |
| u11 | 23 | 30 | 26.5 | 31 | 4.5 | 25.1 | 718 |
| u10 | 22 | 29 | 25.5 | 31 | 5.5 | 30.7 | 716 |

714

712

| Offset | Qn | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|---|
| ps | DRAM | 0 | 6 | 11 | 17 | 22 | 28 | 33 | 39 | 45 | 50 | 56 | 61 | 67 | 73 | 78 | 84 | 89 | 95 |
| 70 | u14 | | | | | | | | | | | | | | | | | | |
| 63 | u13 | | | | | | | | | | | | | | | | | | |
| 61 | u12 | | | | | | | | | | | | | | | | | | |
| 44 | u11 | | | | | | | | | | | | | | | | | | |
| 48 | u10 | | | | | | | | | | | | | | | | | | |

Setup Sweep ---> 708

| 18 | 19 | 20 | 21 | 22 | 23 | 24 | 25 | 26 | 27 | 28 | 29 | 30 | 31 | 32 | 33 | 34 | 35 | 36 | 37 | 38 |
|---|---|---|---|---|---|---|---|---|---|---|---|---|---|---|---|---|---|---|---|---|
| 100 | 106 | 112 | 117 | 123 | 128 | 134 | 140 | 145 | 151 | 156 | 162 | 167 | 173 | 179 | 184 | 190 | 195 | 201 | 206 | 212 |
| 18 | | 19 | 20 | | | | 25 | 26 | 27 | | | | | | | | | | | |
| | | | | 22 | 23 | | | | | | 29 | 30 | | | | | | | | | transition band

<--- Hold Sweep 710

| 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 |
|---|---|---|---|---|---|---|---|---|---|---|---|---|---|---|---|---|---|---|---|---|---|---|---|---|
| 218 | 223 | 229 | 234 | 240 | 246 | 251 | 257 | 262 | 268 | 273 | 279 | 285 | 290 | 296 | 301 | 307 | 312 | 318 | 324 | 329 | 335 | 340 | 346 | 352 |

FIG. 7B

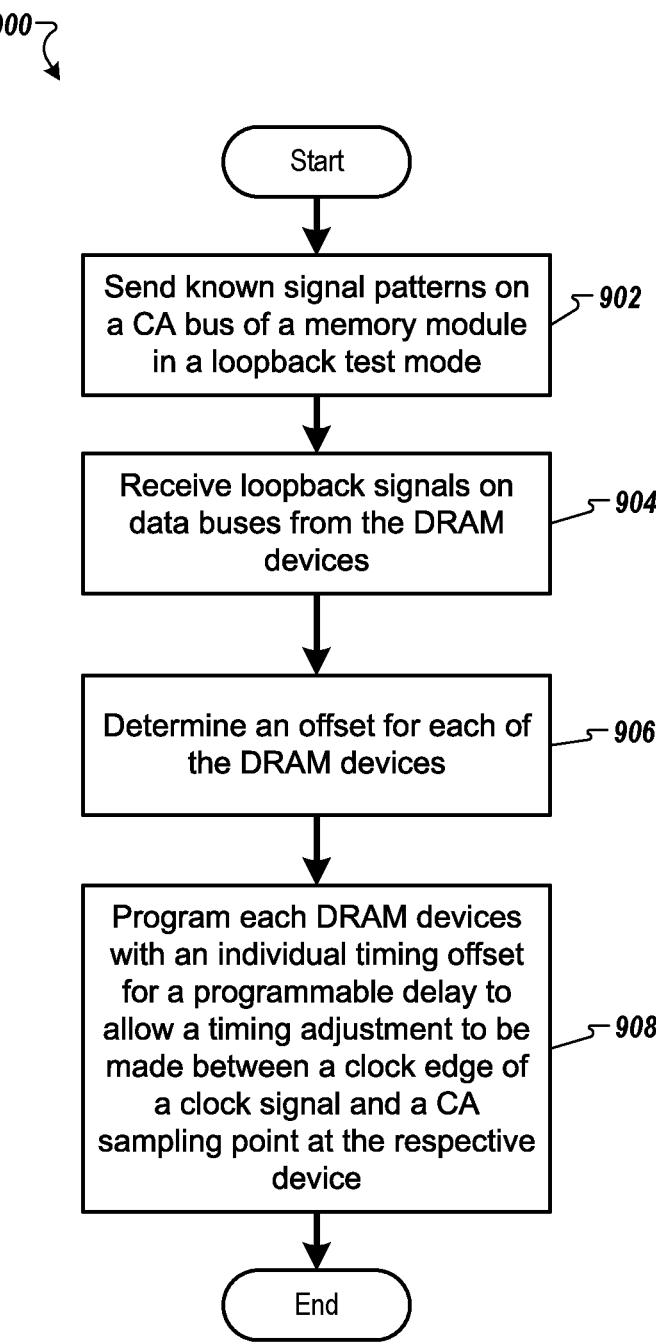

*900*

Start

Send known signal patterns on a CA bus of a memory module in a loopback test mode — *902*

Receive loopback signals on data buses from the DRAM devices — *904*

Determine an offset for each of the DRAM devices — *906*

Program each DRAM devices with an individual timing offset for a programmable delay to allow a timing adjustment to be made between a clock edge of a clock signal and a CA sampling point at the respective device — *908*

End

FIG. 9

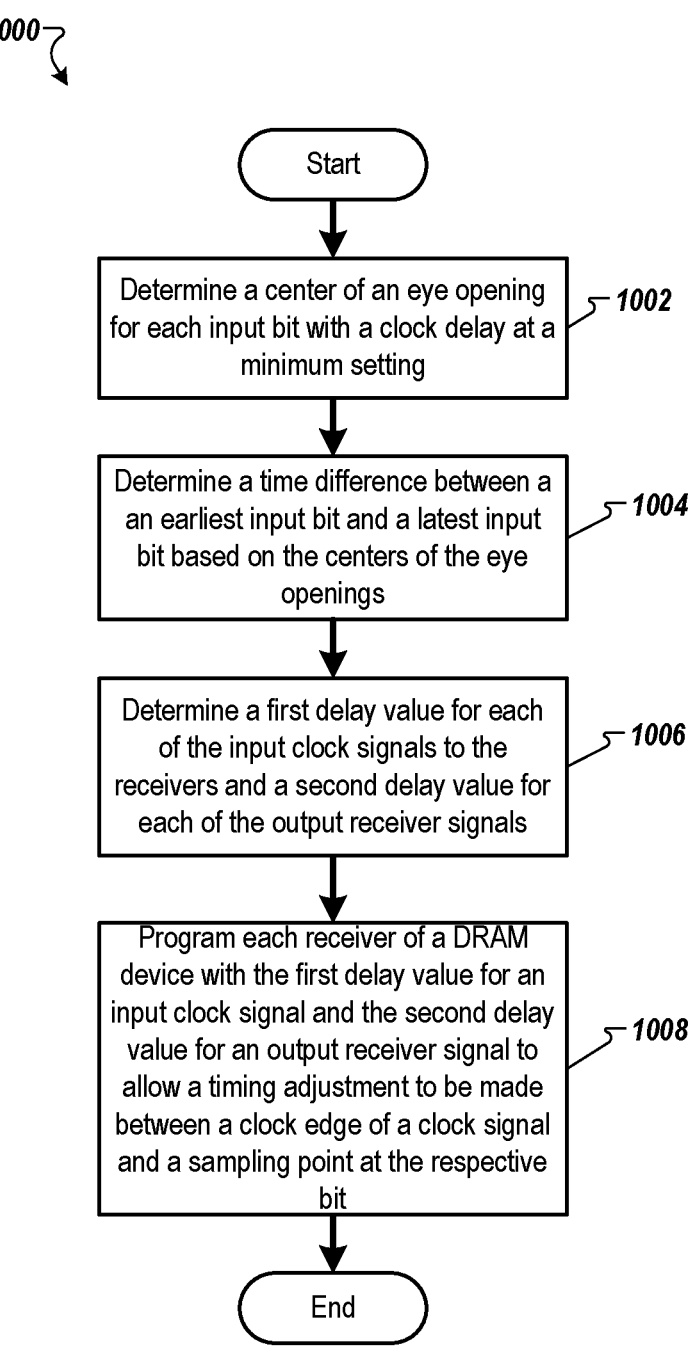

*1000*

Start

Determine a center of an eye opening for each input bit with a clock delay at a minimum setting — *1002*

Determine a time difference between a an earliest input bit and a latest input bit based on the centers of the eye openings — *1004*

Determine a first delay value for each of the input clock signals to the receivers and a second delay value for each of the output receiver signals — *1006*

Program each receiver of a DRAM device with the first delay value for an input clock signal and the second delay value for an output receiver signal to allow a timing adjustment to be made between a clock edge of a clock signal and a sampling point at the respective bit — *1008*

End

FIG. 10

SIGNAL SKEW CORRECTION IN INTEGRATED CIRCUIT MEMORY DEVICES

BACKGROUND

Modern computer systems generally include a data storage device, such as a memory component or device. The memory component may be, for example, a random access memory (RAM) or a dynamic random access memory (DRAM). The memory device includes memory banks made up of memory cells that are accessed by a memory controller or memory client through a command interface and a data interface within the memory device.

BRIEF DESCRIPTION OF THE DRAWINGS

The present disclosure is illustrated by way of example, and not by way of limitation, in the figures of the accompanying drawings.

FIG. 7B is a table illustrating results from a setup sweep and a hold sweep by a loopback test mode, according to an embodiment.

FIG. 9 is a flow diagram of a method for programming a delay circuit of a DRAM device, according to an embodiment.

FIG. 10 is a flow diagram of a method 1000 for programming a delay circuit of a DRAM device, according to an embodiment.

DETAILED DESCRIPTION

The following description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

When conveying signals on a parallel bus, skew, among signals arriving at devices coupled to the bus, can arise from various sources as the devices sample the signals according to a common timing reference. Skew variation at the devices can be caused by clock signals having a different signaling type. Termination of signal lines, drive strengths, manufacturing variations, and other sources can cause skew among devices coupled to a common bus. For example, in a memory system with a fly-by command/address (CA) bus, there can exist a skew variation between a clock edge of a clock signal and CA terminals at each memory location due to different signaling types between these two signals, terminations, drive strength, and slew rate. In some cases, skew variation can be reduced, but not removed entirely. For example, a dual in-line memory module (DIMM) can include a buffer device that receives CA signals and clock signals from a memory controller and re-drives these signals out to memory devices on the DIMM.

Aspects of the present disclosure address the above and other considerations by providing clock skew correction at individual devices coupled to a common bus to improve margins for the common bus when sampling all the signals on the common bus by a common timing reference. In at least one embodiment, clock skew correction can be provided within DRAM devices to improve margins for a CA bus. Aspects of the present disclosure address the above and other considerations by providing a loopback mode and programming a skew correction at individual memory devices that receive the CA signals. In at least one embodiment, a loopback mode can improve the margins for the signaling on the CA bus for a DIMM or on a motherboard. The embodiments described herein use skew correction within DRAMs utilizing DRAM interface training and some additional logic within the DRAM.

Figure 1:
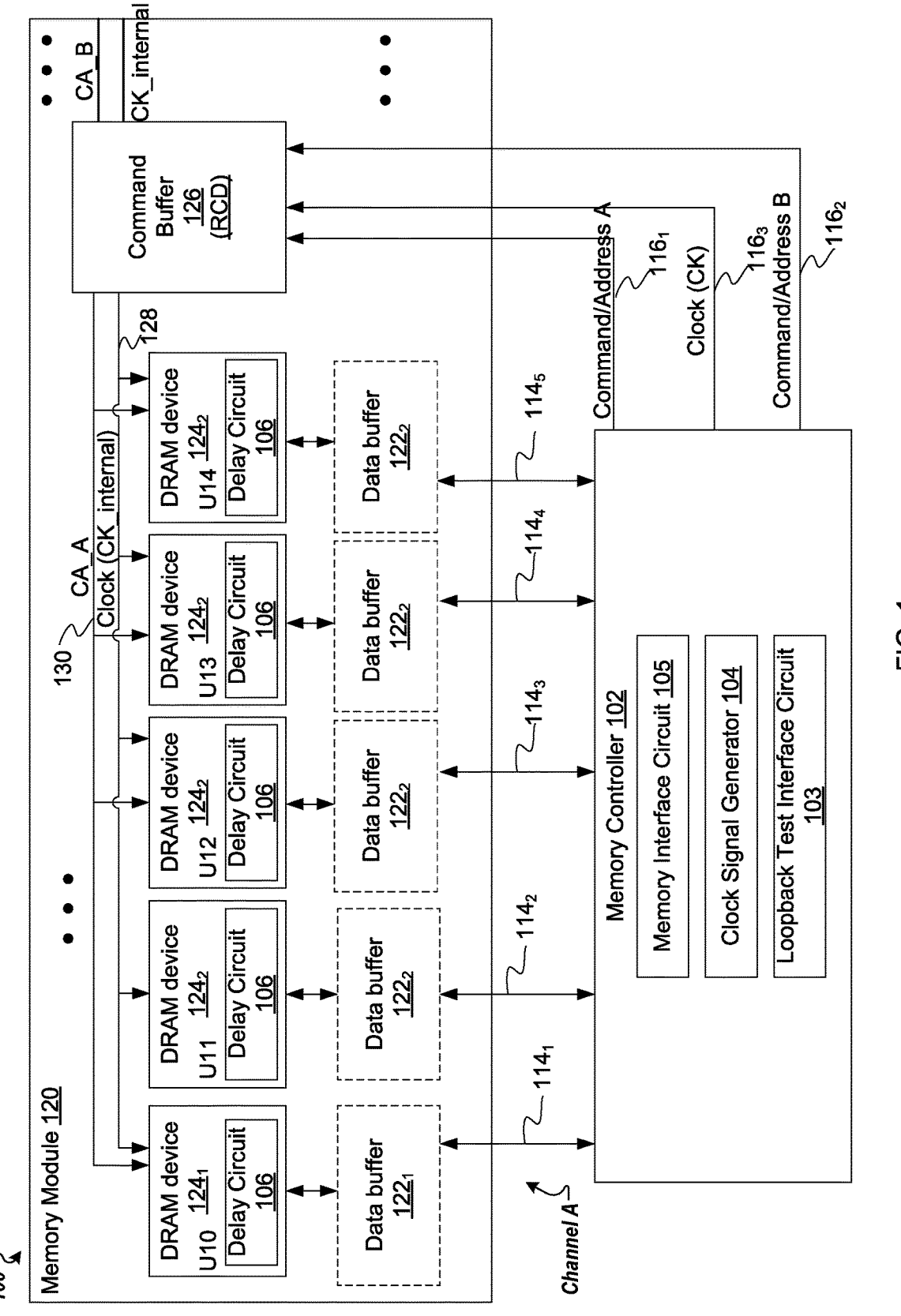
FIG. 1 is a block diagram illustrating a computing environment with a memory controller and DRAM devices configured for individual DRAM skew correction between a clock edge and a command/address (CA) sampling point, according to an embodiment.

FIG. 1 is a block diagram illustrating a computing environment 100 with a memory controller and DRAM devices configured for individual DRAM skew correction between a clock edge and individual signals that are sampled using that clock signal at respective CA receiver circuits, according to an embodiment. The computing environment 100 shows a memory module 120. In another embodiment, one or more memory devices can be connected to a memory controller on a motherboard. As an option, one or more instances of environment 100 or any aspect thereof may be implemented in the context of the architecture and functionality of the embodiments described herein.

As shown in FIG. 1, environment 100 comprises a memory controller 102 coupled to a memory module 120 through one or more buses as described in more detail below. In one embodiment, memory module 120 is a dual in-line memory module (DIMM). Such memory modules can be referred to as DRAM DIMMs, registered DIMMs (RDIMIVIs), or load-reduced DIMMs (LRDIMMs), and can share a memory channel with other DRAM DIMMs.

In one embodiment, the memory controller 102 further comprises a loopback test interface circuit 103, a clock signal generator 104, and a memory interface circuit 105. Memory controller 102 can comprise multiple instances each of loopback test interface circuit 103, clock signal generator 104, and memory interface circuit 105. Clock signal generator 104 may include a phase lock loop (PLL) or other circuits to generate one or more clock signals. The clock signal generator 104 can generate strobe signals for data buses $114_1$-$114_5$ and clock signals for CA buses $116_1$-$116_2$. Interface circuits on the memory controller 102 and DRAM devices can transmit and receive data on data buses. Interface circuits on the memory controller 102 can send bank address, row address, and column addresses, or any combination thereof on CA buses. The DRAM devices can be organized as one or more ranks. A rank is a group of DRAM devices that share a common CA bus. A DIMM can have multiple ranks and multiple DIMMs can be present on one channel. In other embodiments, clock signal generator 104 may receive one or more clock signals from a source external to the memory controller 102. In either embodiment, memory interface circuit 105 may include a driver to drive the one or more clock signals from clock signal generator 104 off of memory controller 102 (e.g., to components such as RCD or Buffer chips on memory module 120).

Specifically, the memory interface circuit 105 can write data to and/or read data from multiple sets of DRAM devices $124_1$-$124_5$ using data buses $114_1$-$114_5$. A DRAM device 124 can include multiple banks, where each bank has a 2D array of storage cells (rows and columns), sense amplifiers, row and column decoders, and peripheral circuits. Memory module 120 can comprise, for example, an array of eight or nine memory devices (e.g., synchronous DRAM (SDRAM)) arranged in various topologies (e.g., A/B sides, single-rank, dual-rank, quad-rank, etc.). In some cases, as shown, the data to and/or from the DRAM devices $124_1$-$124_5$ can optionally be buffered by a set of data buffers $122_1$-$122_5$, respectively. Such data buffers can serve to re-drive the signals (e.g., data signals (DQ) or simply data) on the bus to help mitigate high electrical loads of large computing and/or memory systems. In other embodiments, data buffers $122_1$-$122_5$ are not present in memory module 120.

The memory interface circuit 105 of the memory controller 102 communicates CA signals and clock signals with the memory module 120 through one or more buses. CA signals and clock signals from the memory interface circuit 105 can be received by a command buffer 126, such as a register clock driver (RCD), on the memory module 120 using receiver circuits on the RCD, via a command and address (CA) bus 116. For example, the command buffer 126 might be an RCD such as one included in registered DIMMs (e.g., RDIMMs, LRDIMMs, etc.). Command buffers such as command buffer 126 can comprise logical registers and a phase-lock loop (PLL) to receive and re-drive command and address input signals from the memory controller 102 to the DRAM devices on a DIMM (e.g., DRAM devices $124_1$, DRAM devices $124_2$, etc.), reducing clock, control, command, and address signal loading by isolating the DRAM devices from the memory controller 102 and the system bus 110. In some cases, certain features of the command buffer 126 can be programmed with configuration and/or control settings via registers on the RCD. In one embodiment, command buffer 126 includes receiver circuits that receive a number of command/address signals together with at least one clock signal from memory controller 102 via CA bus 116. Command buffer 126 may divide the received command/address signals into two or more separate groups and generate one or more additional clock signals from the received clock signal. Alternatively, as illustrated in FIG. 1, command buffer 126 can receive CA signals for a first group (Command/Address A) on a first CA bus $116_1$ and CA signals for a second group (Command/Address B) on a second CA bus $116_2$. Command buffer 126 may further sample each of the groups of command/address signals (e.g., subsets of the received command/address signals) according to the received clock signals. As illustrated in FIG. 1, command buffer 126 can receive a clock signal (CK) on a clock line $116_3$ of the CA bus 116. In another embodiment, memory devices of memory module 120 can receive CA signals and clock signals directly from the memory interface circuit 105.

In one embodiment, memory interface circuit 105 receives the CA signals from a processing core (not shown) of memory controller 102 or from some other memory client utilizing the memory system including memory controller 102 and memory module 120, and receives the external clock signals from clock signal generator 104. Memory interface circuit 105 includes transmitter circuits to drive the CA signals (e.g., CAA and CAB) and the external clock signals to memory module 120 over various signal lines that form CA bus 116. In one embodiment, memory interface circuit 105 drives one bit of each of the CA signals CAA and CAB with either or both of each rising and falling edge of external clock signals. In one embodiment, CA bus 116 transmits multiple CA signals CAA and CAB and multiple external clock signals. For example, CAA may include seven separate CA signals, CAB may include seven additional CA signals, and the clock signal may include a pair of differential clock signals. In one embodiment, all of the signals in CA bus 116 are received by command buffer 126 of memory module 120.

In one embodiment, clock signal generator 104 of memory controller 102 generates external clock signals. Memory interface circuit 105 transmits various CA signals and external clock signals to memory module 120 via CA bus 116. In one embodiment, memory interface circuit 105 receives the CA signals from a processing device (not shown) of memory controller 102 or from some other memory client utilizing the memory system including memory controller 102, and memory module 120 receives the external clock signals from clock signal generator 104. Memory interface circuit 105 drives the CA signals (e.g., CAA and CAB) and the external clock signals (e.g., CK) to memory module 120 over various signal lines that form CA bus 116. In one embodiment, memory interface circuit 105 drives one bit of each of the CA signals CAA and CAB with either each rising or falling edge of external clock signals CK.

The memory module 120 shown in environment 100 presents merely one partitioning. It should also be noted that memory module 120 does not show all of the DRAM devices and data buffers that can be present in, for example, a DDR5 DIMM. In other embodiments, in addition to or in the alternative, memory module 120 may include other memory devices, such as SDRAM, Rambus DRAM (RDRAM), static random access memory (SRAM), non-volatile memory device like NAND flash, etc. In another embodiment, memory modules can be a memory card, like an SD card, an eMMC device, or the like. The specific example shown where the command buffer 126 and the DRAM devices $124_1$-$124_2$ are separate components is purely exemplary, and other partitioning is possible. For example, any or all of the components comprising the memory module 120 and/or other components can comprise one device (e.g., system-on-chip or SoC), multiple devices in a single package or printed circuit board, multiple separate devices, and can have other variations, modifications, and alternatives. In addition, memory controller 102 may include components in addition to and/or different from those illustrated in FIG. 1. Furthermore, the illustrated components may be arranged differently depending on the embodiment.

In a source-synchronous system, data signals sent from a source (e.g., a memory controller 102) to a receiver (e.g., a buffer chip on a memory module 120) are synchronized to strobe signals (which also may be referred to as clock signals) provided by the source and transmitted along with the data signals.

In a double data rate (DDR) memory system, there may be, for example, eight data signals transmitted from the memory controller 102 to the memory module 120, with one bit from each of the eight signals forming a byte of data written to the memory module 120. Each four-bit aggregation (i.e., each nibble) may have a corresponding clock signal (e.g., a differential clock signal) used as a reference clock to transfer the signals. Within each nibble, the four data signals are synchronized to the same clock, however, all signals need to be synchronized in the synchronous system. Accordingly, many systems perform a nibble-skew alignment operation to cause all data signals (DQ) and clock signals (DQS) to be synchronized at the receiver.

As described above, the memory module 120 can have a fly-by CA bus and point-to-point data lines, as illustrated in FIG. 1. The command buffer 126 can receive a clock signal (CK) on clock line 116$_3$ and can re-drive an internal clock signal 128 (CK_internal) on a clock line of the fly-by CA bus. The command buffer 126 can receive CA signals (Command/Address A) for a first group of DRAMs and can re-drive CA signals 130 on the fly-by CA bus.

As described above, there can exist a skew variation between a clock edge of a clock signal and CA terminals at each DRAM location on the fly-by CA bus, for example, at signaling rates of 5600 Mbps and higher, such as illustrated and described below with respect to FIG. 2. The skew variation can be caused due to different signaling types between the CA signals and the CK signal. For example, the CK signal can be a differential signal, whereas the CA signals can be single-ended signals. Termination, drive strength, and slew rate can also contribute to the skew variation. To address the skew variation, each DRAM device 124 includes a delay circuit 106. Delay circuit 106 can include a mode register to store a value representative of a timing offset for a programmable delay applied to a signal received at a CA line, a CK line, or both. The programmable delay allows for a timing adjustment to be made between a clock edge of the internal clock signal 128 and a CA sampling point at one or more receiver circuits at each respective DRAM device 124. The delay circuit 106 can include circuitry to make the individual timing adjustment at the respective DRAM device 124. The delay circuit 106 can be programmed by the memory controller, for example, in a CA bus loopback mode. In the CA bus loopback mode, a loopback test interface circuit 103 of the memory controller 102 can send known signal patterns on the CA bus interface 116 and receive signals looped back via the data bus interface 114. More specifically, each individual DRAM device 124 includes a data interface which includes a transmitter to transmit data to the memory controller 102 in a normal mode and transmit the received signal patterns in the loopback mode. In an embodiment the loopback test interface circuit 103 can determine an offset for the respective DRAM device 124 and the memory controller programs the delay circuit 106 with values representative of the individual timing offset for a programmable delay. In at least one embodiment, memory controller 102 programs a mode register by sending a mode register set command with a delay value. Memory controller 102 can program each DRAM device 124 by programming each mode register individually. The delay circuit 106 produces an individual timing offset for a timing adjustment between a clock edge of the internal clock signal 128 and a CA sampling point at the respective DRAM device. By individually programming the different delay circuits 106 at the different DRAM devices 124 results in aligning a clock edge at each of the individual DRAM devices at a center or closer to a center of the respective eye openings for sampling CA signals at the individual DRAM devices.

In one embodiment, loopback test interface circuit 103 can use a loopback mode process to correct skew at individual devices coupled to a common bus and the devices are sampled by a common timing reference. The loopback test interface circuit 103 can be implemented as discrete logic, digital signal processing blocks, or a circuit block with functionality to perform the operations described herein. Alternatively, the functionality of the loopback test interface circuit 103 can be a set of instructions executed by a processing device of memory controller 102.

In one embodiment, a mode register of a delay circuit 106 stores a first digital value which represents a first timing offset for a clock line and a second digital value representative of a second timing offset for CA bits (CA lines). In another embodiment, a mode register of a delay circuit 106 stores a first digital value for a clock line and a set of digital values, each corresponding to one of the CA bits. In another embodiment, a mode register of a delay circuit 106 stores a first set of digital values to delay signals received at a receiver of each clock line corresponding to each CA line by a first set of programmable delays, one programmable delay for each clock line, and a second set of digital values to delay signals received at a receiver of each CA bit by a second set of programmable delays. Alternatively, a mode register can store one or more values to make timing adjustments between a clock edge and a CA sampling point of one or more CA bits.

Figure 2:
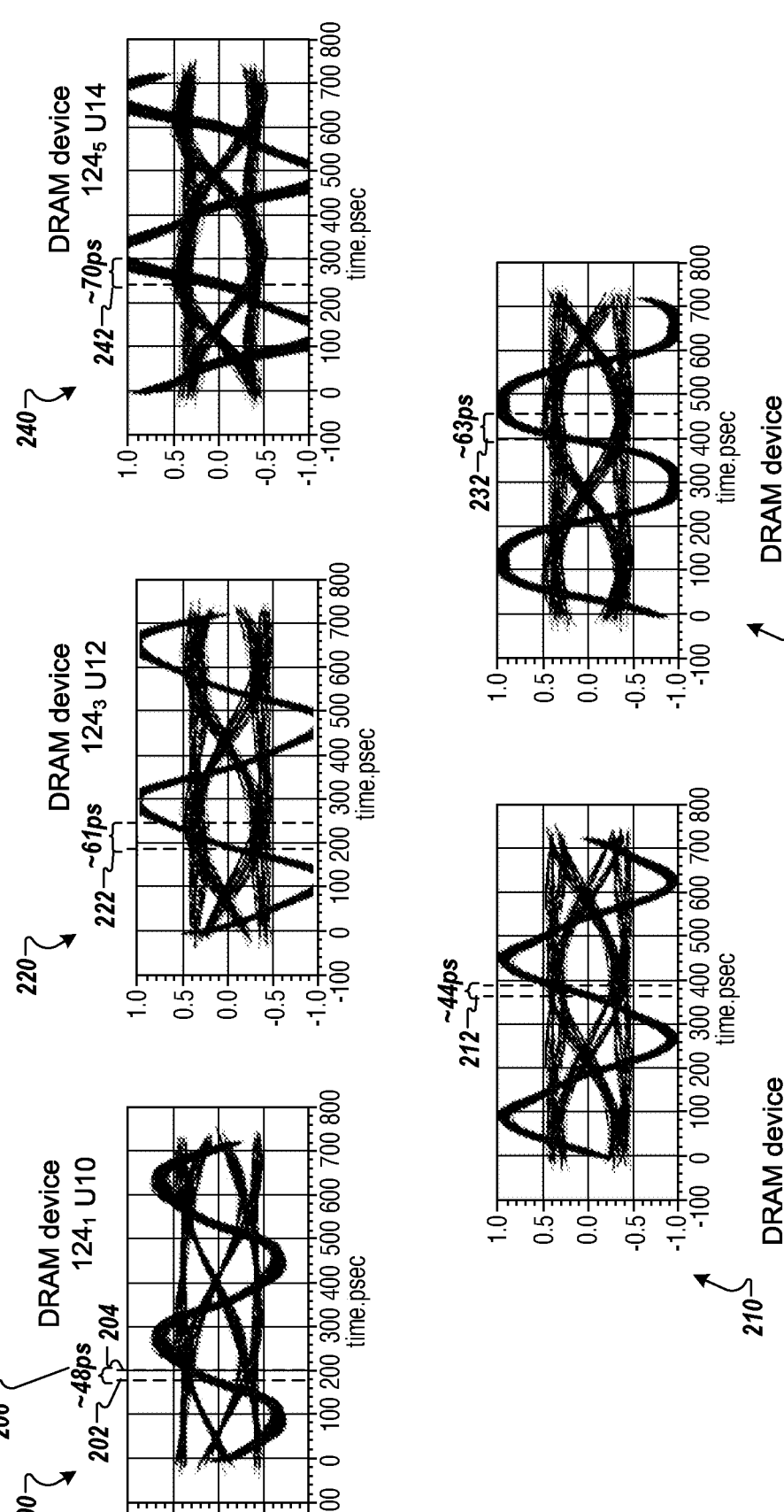
FIG. 2 illustrates a set of eye diagrams illustrating different clock-to-CA skews at five DRAM devices of FIG. 1, according to an embodiment.

FIG. 2 illustrates a set of eye diagrams illustrating different clock-to-CA skews at five DRAM devices of FIG. 1, according to an embodiment. Each of the DRAM devices 114$_1$-124$_5$ (labeled U10-U14 in FIGS. 1-2) receives the internal clock signal 128 but each can have a different skew between a clock edge and a center of an eye opening. As illustrated in eye diagram 200 corresponding to the first DRAM device 114$_1$, a clock edge 202 of the internal clock signal 128 is offset from a center 204 of an eye opening by a first offset amount 206 (e.g., approximately 48 ps). Eye diagram 210 shows a second offset amount 212 (e.g., approximately 44 ps) between a clock edge and a center of a respective eye opening at the second DRAM device 114$_2$. Eye diagram 220 shows a third offset amount 222 (e.g., approximately 61 ps) between a clock edge and a center of a respective eye opening at the third DRAM device 114$_3$. Eye diagram 230 shows a fourth offset amount 232 (e.g., approximately 63 ps) between a clock edge and a center of a respective eye opening at the fourth DRAM device 114$_4$. Eye diagram 240 shows a fourth offset amount 242 (e.g., approximately 70 ps) between a clock edge and a center of a respective eye opening at the fifth DRAM device 114$_5$. As illustrated in FIG. 2, a clock signal can be placed close to a center of a unit interval (UI) by the command buffer 126 (e.g., RCD), but a clock-to-CA skew (QCK-QCA) is different depending on DRAM location. A clock edge can be offset from the center of UI in a range of approximately 48 to 70 ps, for example, depending on DRAM location.

As described above, loopback test interface circuit 103 can measure each of the offset amounts in a loopback mode and can program the respective delay circuits 106 with a value representative of an individual timing offset to make a timing adjustment between a clock edge of a clock signal and a CA sampling point (e.g., a center or near a center of an eye opening) at the respective DRAM device 124. For example, loopback test interface circuit 103 can program a first delay circuit 106 at a first DRAM device 124₁ with a first value (e.g., approximately 48 ps) corresponding to the first offset amount 206. Similarly, loopback test interface circuit 103 can program a second delay circuit 106 at a second DRAM device 124₂ with a second value (e.g., approximately 44 ps) corresponding to the second offset amount 212. The other DRAM devices can be programmed with values commensurate with the offset amounts 222, 232, 242, respectively. By individually programming the delay circuits 106, the skew variation can be reduced between DRAM devices.

Figure 3:
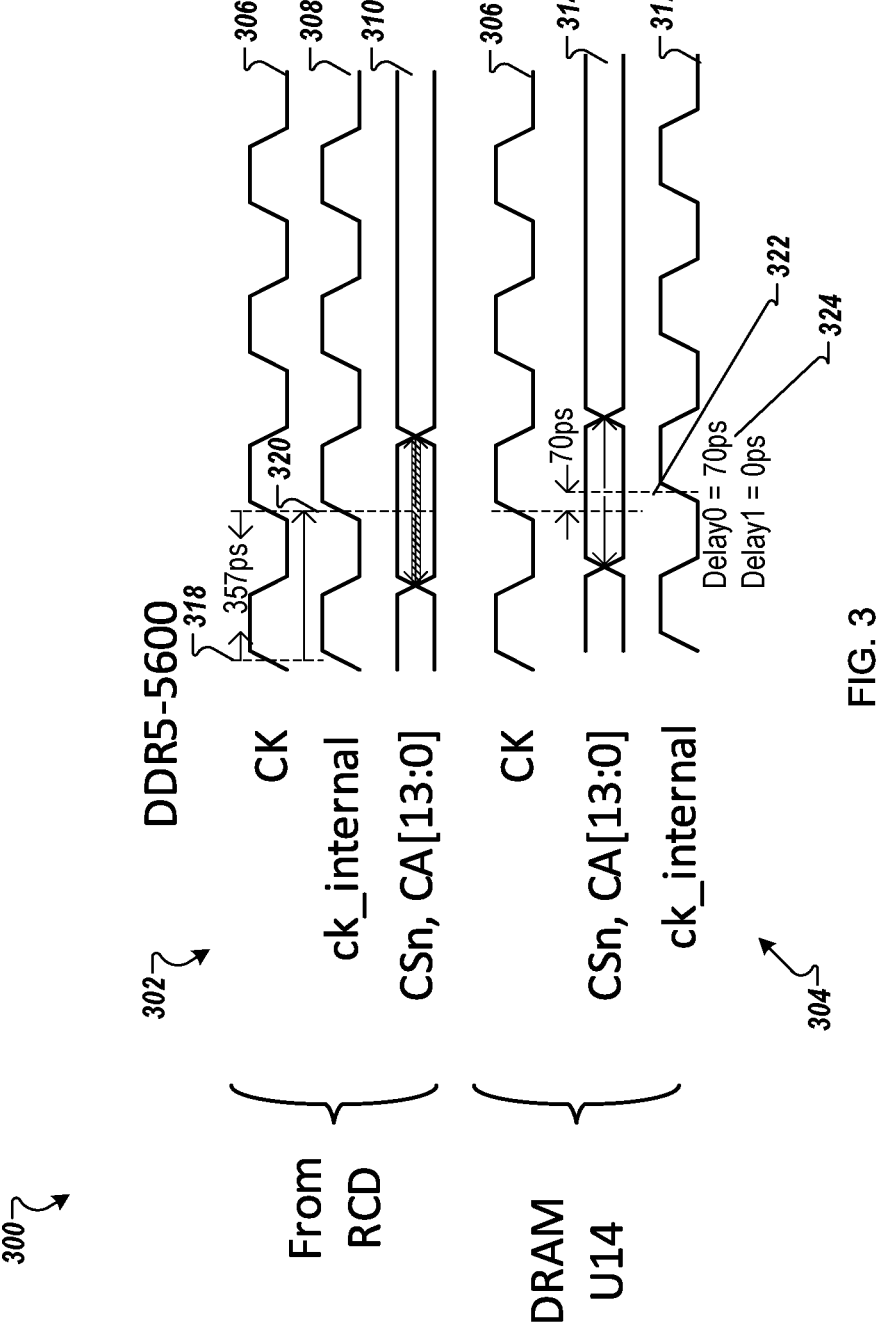
FIG. 3 is a timing diagram of signals received by and sent from a command buffer and signals received at a respective DRAM device, according to an embodiment.

FIG. 3 is a timing diagram 300 of signals 302 received by and sent from a command buffer and signals 304 received at a respective DRAM device, according to an embodiment. Signals 302 include a clock signal (CK) 306, an internal clock signal (ck_internal) 308, chip select (CSn) and CA signals 310. Signals 304 include the clock signal (CK) 306 (for reference), an internal clock signal (ck_internal) 312, and chip select (CSn) and CA signals 314. One unit interval (UI) can be a full clock cycle, such as 357 ps for the DDR5-5600. It should be noted that DDR5-5600 is a specific example speed bin and, in other embodiments, other memory technologies and speeds can be used. Similarly, the embodiments described herein can be used to program each device of a set of devices that are coupled to a common parallel bus and where signals on the common parallel bus are sampled at each of the set of devices using a common timing reference.

Referring back to FIG. 3, a command buffer (RCD) can receive the clock signal 306 and re-drive it to each DRAM device. Each DRAM device receives the re-driven clock signal after being buffered by a clock receiver and is referred to as internal clock signal 308. The internal clock 308 can be a delayed version of the clock signal 306. For example, the internal clock 308 can be UI behind clock signal 306, as illustrated by a clock edge 318 of clock signal 306 and a corresponding clock edge 320 of internal clock signal 308. Clock edge 320 can be used to sample the CSn and CS_A signals 310 sent from the command buffer. As shown in FIG. 3, clock edge 320 of the internal clock signal 308 is aligned at the center of the UI as the CA sampling point. Signals 302 are output from the command buffer, but depending on a DRAM location, there can be skew between when the clock signal is received at the respective DRAM location, which becomes the internal clock signal 308 after being buffered by a clock receiver. As illustrated in FIG. 3, the DRAM device receives from the command buffer the clock signal that becomes internal clock signal 312 after being buffered by a clock receiver. The internal clock signal 312 is delayed by a first amount (e.g., 70 ps). That is, a clock edge 322 of the internal clock signal 312 is delayed by the first amount from the clock edge 320 of clock signal 308. As described herein, the delay circuit 106 can be programmed with a first value 324 (e.g., 70 ps).

Figure 4:
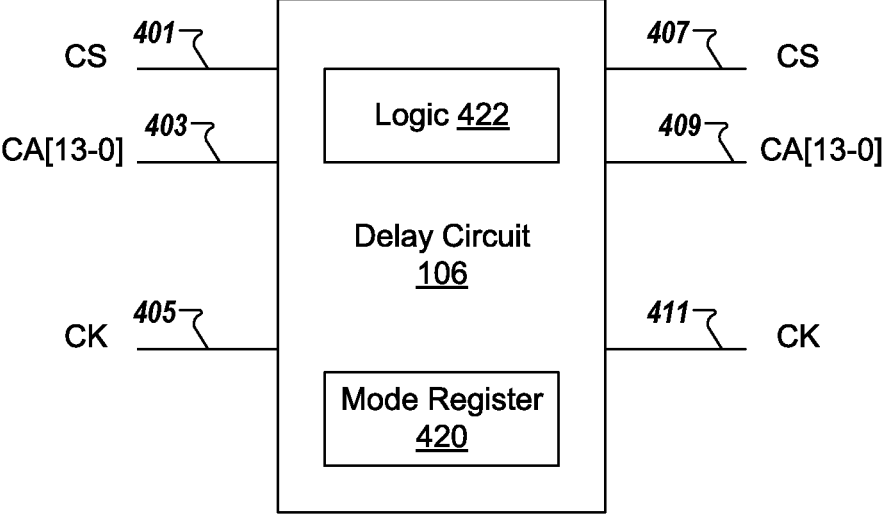
FIG. 4 is a block diagram illustrating a delay circuit for making a timing adjustment between a clock edge and a CA sampling point, according to an embodiment.

FIG. 4 is a block diagram illustrating a delay circuit 106 for making a timing adjustment between a clock edge and a CA sampling point, according to an embodiment. Delay circuit 106 receives a chip select (CS) signal 401, CA signals 403, and clock (CK) signal 405. Delay circuit 106 includes mode register 420 and logic 422. Mode register 420 can be programmed to store one or more values for programmable delays on the CK signal 401, CA signals 403, and CK signal 405, or any combination thereof. Logic 422 can be controlled by mode register 420 to make the timing adjustments between a clock edge and a CA sampling point at the respective DRAM device in which the delay circuit 106 resides. Delay circuit 106 outputs the one or more delayed signals, including CS signal 407, CA signals 409, and CK signal 411. Logic 422 can be controlled by mode register 420 to make the timing adjustments. Logic 422 can include various logic gates and buffers in order to make the necessary timing adjustments specified by the values stored in the mode register 420. Examples of logic 422 are described below with respect to FIGS. 5-6.

In one embodiment, the timing offsets represent an amount of skew between the CK signal 405 and CA signals 403. The timing offset can be set by a value stored in mode register 420 associated with delay circuit 106. Depending on the embodiment, the mode register 420 may be located locally in proximity to delay circuit 106 itself or may be located at a location elsewhere within DRAM device 124 from which delay circuit 106 can be configured by the contents of the mode register 420. In one embodiment, a processing device coupled to memory controller 102 or memory controller 102 writes a corresponding value to the associated mode register 420, the value representing the desired amount of signal skew to be introduced (i.e., the corresponding timing offset) for CS signal 401, CA signals 403, CK signal 405, or any combination thereof, which, when applied, will result in the skewed output signals (407, 409, 411) being generated at the output of delay circuit 106.

In one embodiment, loopback test interface circuit 103 is configured to program the register values with the timing offset amounts during a loopback mode operation. The loopback mode operation may include measuring an amount of skew between the CA signals 403 and CK signal 405, as well as interference attributable to the transitions in the signals propagating on the signal lines. Loopback test interface circuit 103 may measure the interference detected for a number of different offset amounts (e.g., systematically changing the offset amount by a step value as described below) to identify an offset amount where interference is minimized or at least shifted. Accordingly, CA signals 409 can be sampled in response to a rising or falling edge of CK signal 411. As a result of decreasing or shifting the skew, the CK signal 411 is shifted to a center of an eye opening of CS signal 407, CA signals 409, or both, resulting in an improved eye opening.

Figure 5:
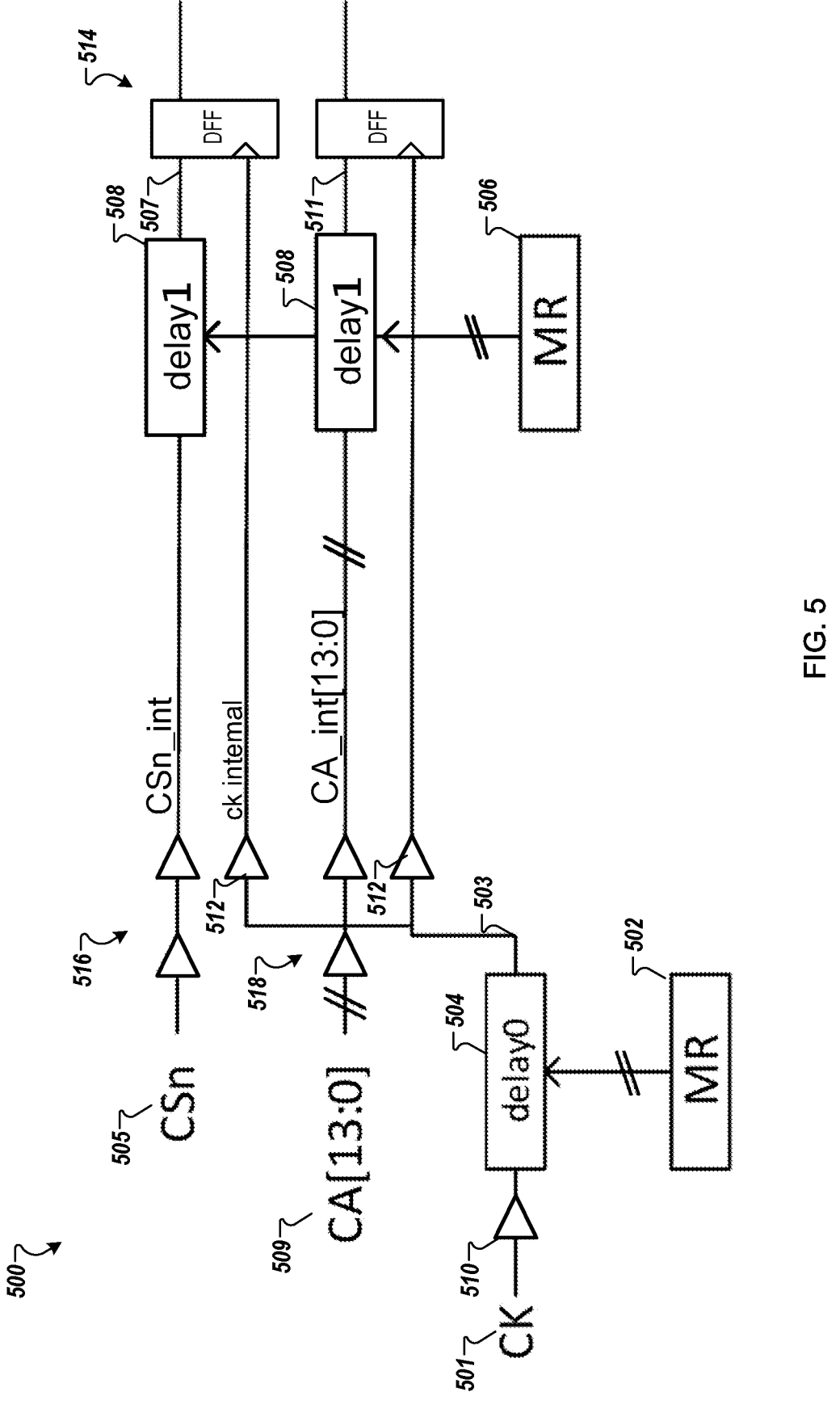
FIG. 5 is a block diagram illustrating a DRAM CA interface with programmable delays between a clock signal and CA/CS signals according to an embodiment.

FIG. 5 is a block diagram illustrating a DRAM CA interface 500 with programmable delays between a clock signal and CA/CS signals according to an embodiment. DRAM CA interface 500 includes a first mode register 502, a first delay element 504, a second mode register 506, and a set of delay elements 508. The first delay element 504 is controlled by a first value stored in the first mode register 502. The first delay element 504 delays a clock edge of clock signal 501 by a first programmable delay corresponding to the first value. The clock signal 501 can be buffered by a first buffer 510 before the first delay element 504 and the first delay element 504 can generate a delayed clock signal 503 that can be buffered by buffers 512 in individual clock lines that are coupled to sampling circuits 514. In another embodiment, the first delay element 504 can be replicated and located after buffers 512 in the individual clock lines. Each of these multiple delay elements can be controlled by a single value or by individual values.

The second delay elements 508 are controlled by a second value stored in the second mode register 506. One of the second delay elements 508 delays a chip select (CS) signal 505 by a second programmable delay corresponding to the second value. The CS signal 505 can be buffered by buffer 516 before the second delay element 508 and the second delay element 508 can generate a delayed CS signal 507 that is coupled to one of the sampling circuits 514. Multiple second delay elements 508 delay CA signals 509 by the second programmable delay corresponding to the second value. The CA signals 509 can be buffered by buffer 518 before the second delay elements 508 and the second delay elements 508 can generate delayed CA signals 511 that are coupled to the respective sampling circuits 514.

In one embodiment, the first mode register 502 and the second mode register 506 are in a single register that stores the two separate values (delay0, delay1). As described herein, the separate values can be programmed to individually adjust timing offsets between clock edges and sampling points.

In another embodiment, the first delay element 504 is controlled by the first value to delay the clock edge of clock signal 501, and multiple second delay elements 508 are controlled by a second value to delay a receiver of each CA bit by the second programmable delay. In another embodiment, the first delay element 504 is controlled by the first value to delay the clock edge of clock signal 501, and multiple second delay elements 508 are each individually controlled by a respective programmable delay. That is, each of the individual CA and CS lines can be independently programmed to have a specific value for that particular line. As described herein, each of the individual lines, including CS lines, CA lines, and CK lines can be individually programming using values stored in one or more mode registers.

Figure 6:
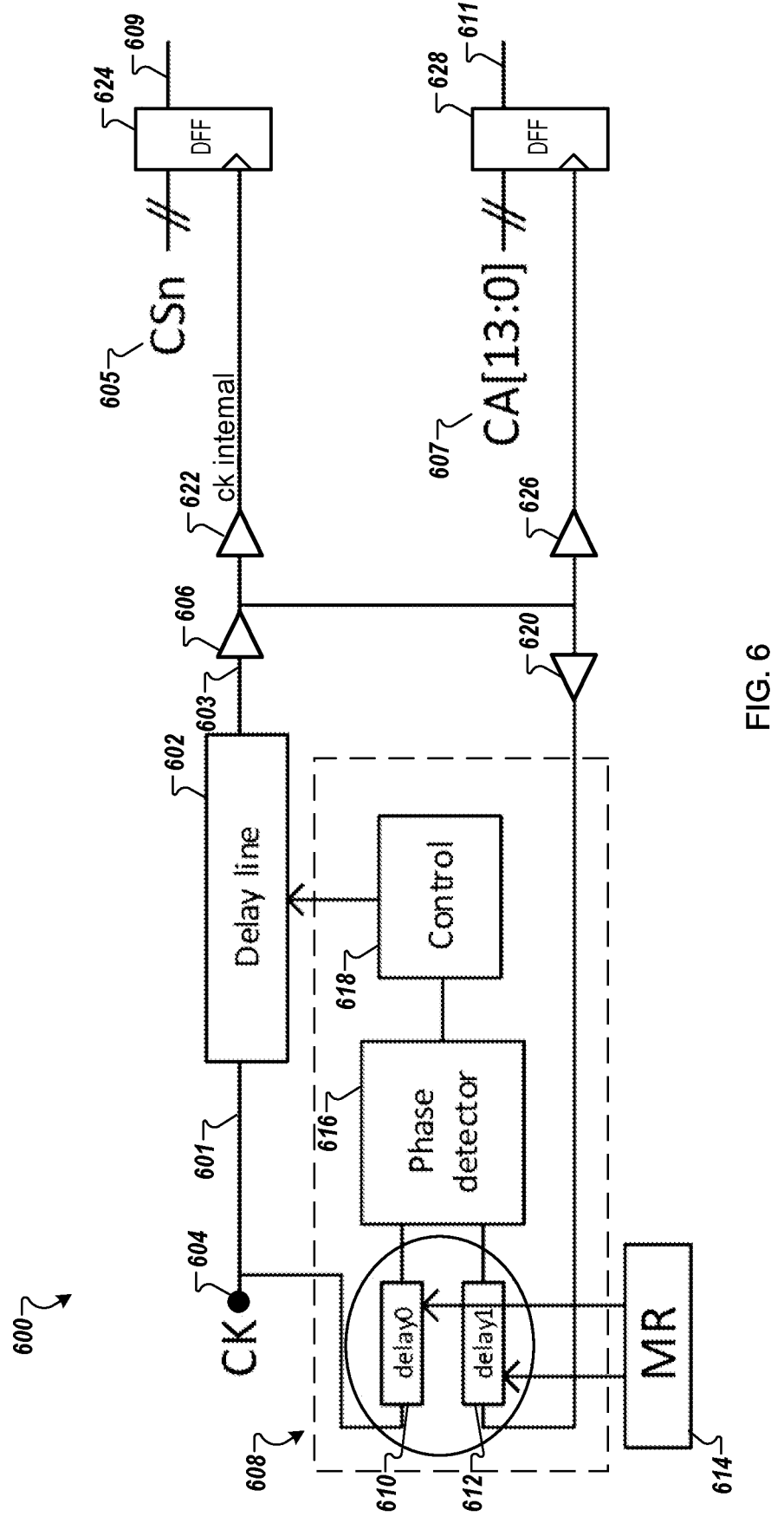
FIG. 6 is a block diagram illustrating a clock delay circuit for making a timing adjustment between a clock edge and a CA sampling point, according to an embodiment.

FIG. 6 is a block diagram illustrating a clock delay circuit 600 for making a timing adjustment between a clock edge and a CA sampling point, according to an embodiment. Clock delay circuit 600 includes a programmable delay line 602, which is coupled between a clock terminal 604 and a clock buffer 606, and a delay locked loop (DLL) circuit 608. DLL circuit 608 includes a first delay element 610 and a second delay element 612. The DLL circuit 608 controls a programmable delay of the programmable delay line 602 using the first delay element 610 and the second delay element 612. Programmable delay line 602 receives a clock signal 601, delays the clock signal 601 by the programmable delay, and generates a delayed clock signal 603. The first delay element 610 is controlled by a first value stored in a mode register 614 and the second delay element 612 is controlled by a second value stored in the mode register 614.

In one embodiment, the DLL circuit 608 also includes a phase detector 616 that receives a first clock signal 601 from the first delay element 610 and delayed clock signal 603 from the programmable delay line 602. The first delay element 610 can delay the first clock signal 604 by a first programmable delay corresponding to the first value. The second delay element 612 can delay the delayed clock signal 603 by a second programmable delay corresponding to the second value. The phase detector 616 detects a phase difference between the delayed first clock signal and the delayed second clock signal and outputs an indication of the phase difference to a control circuit 618 that makes a corresponding adjustment to the programmable delay of the programmable delay line 602.

Buffer 606 can buffer the delayed clock signal 603 that is feedback and buffered again by buffer 620 before the second delay element 612 since the delayed clock signal 603 is buffered again by buffer 622 before being applied to sampling circuits 624 that sample chip select (CS) signals 605. The delayed clock signal 603 is also buffered again by buffer 626 before being applied to sampling circuits 628 that sample CA signals 607. Sampling circuits 624 output the sampled CS signals 609 and sampling circuits output the sampled CA signals 611.

In another embodiment, a first set of delay elements can be controlled by a first set of values stored in the mode register to delay a receiver of each clock line corresponding to each CA bit by a first set of programmable delays and a second set of delay elements can be controlled by a second set of timings offsets stored in the mode register to delay a receiver of each CA bit (and/or CS bit) by a second set of programmable delays.

In one embodiment, a first delay element that is located on a clock line is controlled by a first value stored in the mode register, to delay a clock signal on the CK line by a first programmable delay. A second delay element that is located on a CA line is controlled by a second value stored in the mode register to delay a CA signal on the first CA line by a second programmable delay. In another embodiment, a third delay element that is located on a CS line is controlled by a third value stored in the mode register to delay a CS signal on the CS line by a third programmable delay. The second programmable delay and the third programmable delay can be the same. The first, second, and third delay elements can be replicated one or more times to individually or collectively correct skews between the clock signal and each of the CA/CS signals. For example, a fourth delay element located on a second CA line is controlled by the second value stored in the mode register to delay a second CA signal on the second CA line by the second programmable delay. Alternatively, the fourth delay element can be controlled by its own value to delay the second CA signal by its own programmable delay independent of the second programmable delay for the CA signal on the first CA line.

Figures 7A, 7C:
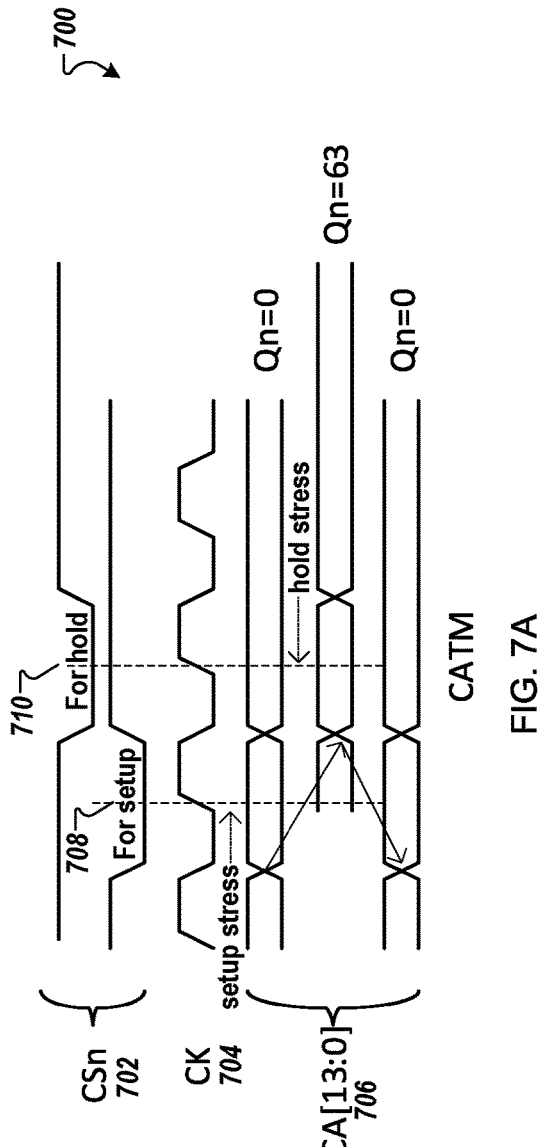
FIG. 7A is a timing diagram of a chip select signal, a clock signal, and CA signals for a loopback test mode to program timing offsets, according to an embodiment.
FIG. 7C is a table with individual timing offset for each of the DRAM devices from a loopback test mode, according to an embodiment.

As described herein, one or more values of the delay elements can be programmed during a loopback test mode by the memory controller 102, such as illustrated in FIGS. 7A-7C. Memory controller 102 can perform a loopback test mode 700 in which it performs a setup sweep 708 and a hold sweep 710. FIG. 7A is a timing diagram of a chip select (CS) signal 702, a clock signal 704, and CA signals 706 for the loopback test mode 700 to program values corresponding to timing offsets, according to an embodiment. Memory controller 102, using loopback test interface circuit 103, performs a setup sweep 708 and a hold sweep 710 for each DRAM device in a loopback test mode (also referred to as CA training mode (CATM) and stores the results (CATM results) in a table 712, such as illustrated in FIG. 7B. Utilizing the loopback test mode, the memory controller can sweep CA lines to the DRAM interface, keeping the CK at the same phase, and the outputs from the DRAM devices are sent on data buses to the memory controller, the outputs indicating CA setup and hold times. Based on the simulation data, CATM results for each DRAM will be reflected as shown in FIGS. 7B-7C. Memory controller 102 can use the CATM results in table 712 to create a timing offset table 714, such as illustrated in FIG. 7C that includes individual timing offsets for each of the DRAM devices from the loopback test mode 700. That is, the memory controller can use the CATM results to compensate for the skew of CA versus CK for each DRAM independently. The skew variations that are due to termination, drive strength, slew-rate and DIM manufacturing can be trained out for each DRAM independently. Table 714 includes a first timing offset 716 for a first DRAM device, a second timing offset 718 for a second DRAM device, a third timing offset 720 for a third DRAM device, a fourth timing offset 722 for a fourth DRAM device, and a fifth timing offset 724 for a fifth DRAM device. The timing offsets are different values and corresponding to the appropriate timing adjustments to be made between the clock signal 704 and CS signal 702 and CA signals 706 at the respective DRAM device. In one embodiment, respective first delays (delay0) can be programmed in mode registers (MRs) of DRAM devices with the correction values to improve the setup and hold margins for all DRAM devices. The memory controller can use a per DRAM addressability (PDA) mode to program the MRs of the DRAM devices. Similarly, respective second delays (delay1) can be programmed in MRs with correction values to improve the setup and hold margins for all DRAM devices. In this particular example, the second delay (delay1) is kept at zero for this condition since the CK is left of center of the individual eyes. Alternatively, different combinations of first and second delays can be used to improve the setup and hold margins for the DRAM devices.

In another embodiment, a controller can send a pattern of signals to a device, such as a DRAM device. The device receives the pattern of signals on a first interface and sends sample results of the pattern of signals on a data interface back to the controller. The controller can set an optimal sampling point for the device using delays based on the sample results. The controller can program a mode register of the device with a value that sets the optimal sampling point. For example, the controller can send a mode register command to program one or more delay elements to set the optimal sampling point for the device. In another embodiment, the controller can program multiple devices, such as multiple DRAM devices, that are coupled to a common bus. In this embodiment, the controller can send a pattern of signals to the multiple devices and receive sample results of the pattern of signals from each data interface of the respective devices. The controller can set an optimal sampling point for each of the multiple devices based on the different sample results received from the multiple devices.

As described above a memory controller can program individual timing offsets for each of the DRAM devices. In other embodiments, the functionality and operations of the memory controller can also be performed in a command buffer, such as the RCD of a memory module, such as illustrated and described with respect to FIG. 8.

Figure 8:
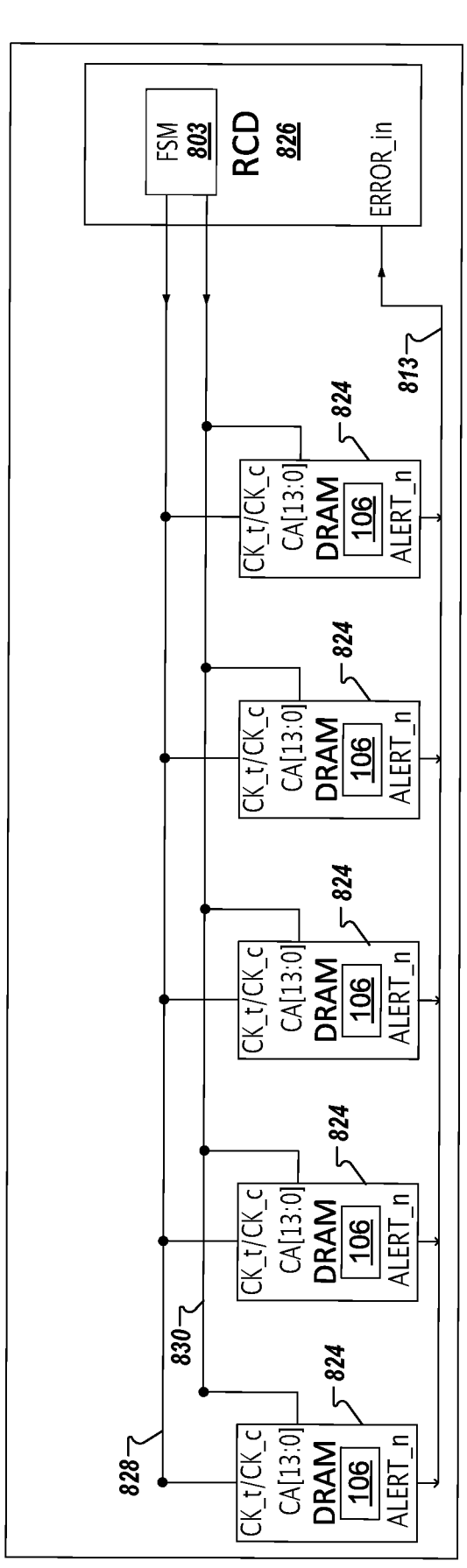
FIG. 8 is a block diagram of a command buffer with timing adjustment capabilities, according to an embodiment.

FIG. 8 is a block diagram of a command buffer 826 with timing adjustment capabilities, according to an embodiment. Command buffer 826 can operate similar to command buffers 126 of FIG. 1, except that the command buffer 826 includes a finite state machine (FSM) 803 to perform measurements of the DRAM devices and program values corresponding to the individual timing offsets of the respective DRAM devices. The FSM 803 can sweep the CA bus to each DRAM using a PDA mode and get the feedback on an error line 813. Each DRAM device can output data on an alert pin (ALERT n) that is coupled to an error input pin (ERROR in) of the command buffer 826. The FSM 803 can find the setup and hold windows for the CA bus for programming the particular DRAM at that DRAM location. The FSM 803 can program the corresponding timing offsets (delay values) within a DRAM device at a best sampling point for that particular DRAM location. The FSM 803 can also extend the process to program the individual timing adjustments on a per-bit basis with DRAMs if the DRAMs have per bit delay elements that can be independently programmable.

FIG. 9 is a flow diagram of a method 900 for programming a delay circuit of a DRAM device, according to an embodiment. The method 900 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 900 is performed by memory controller 102, as shown in FIG. 1. In another embodiment, the method 900 is performed by a command buffer 826, as shown in FIG. 8.

Referring to FIG. 9, at block 902, method 900 begins by sending known signal patterns on a CA bus of a memory module in a loopback test mode. The memory module includes multiple DRAM devices at different DRAM locations on a fly-by CA bus. Processing logic receives loopback signals on data buses from the DRAM devices (block 904). Processing logic determines an offset for each of the DRAM devices (block 906). Processing logic programs each of the DRAM devices with a value representative of an individual timing offset for a programmable delay to allow a timing adjustment to be made between a clock edge of a clock signal and a CA sampling point at the respective DRAM device (block 908), and the method 900 ends.

In a further embodiment, the processing logic determines, based on the loopback signals for a first DRAM device, a first timing offset between a first clock edge and a CA sampling point at the first DRAM device. The processing logic sends a first value representative of the first timing offset to the first DRAM device. The first DRAM device can store the first value in a mode register. In another embodiment, the processing logic further determines, based on the loopback signals for a second DRAM device, a second timing offset between a second clock edge and a second CA sampling point at the second DRAM device and sends a second value representative of the second timing offset to the second DRAM device, the second timing offset being different than the first timing offset. The second DRAM device can store the second value in a mode register.

In another embodiment, processing logic determines, based on the loopback signals for a first DRAM device, a first timing offset for a clock signal, and a second timing offset for a CA signal at the first DRAM device. Processing logic sends a first value representative of the first timing offset and a second value representative of the second timing offset to the first DRAM device. The first value and the second value, when applied to one or more delay elements at the first DRAM device, correct a first skew between a first clock edge and a CA sampling point at the first DRAM device. In a further embodiment, processing logic further determines based on the loopback signals for a second DRAM device, a third timing offset for a second clock signal, and a fourth timing offset for a second CA signal at the second DRAM device. Processing logic sends a third value representative of the third timing offset and a fourth value representative of the fourth timing offset to the second DRAM device. The second DRAM device can store the third value and the fourth value in a mode register. The third value and the fourth value, when applied to one or more delay elements at the second DRAM device, correct a second skew between a second clock edge and a second CA sampling point at the second DRAM device.

In another embodiment, processing logic determines, based on the loopback signals for a first DRAM device, a first timing offset between a first clock edge and a chip select (CS) sampling point at the first DRAM device and sends a first value representative of the first timing offset to the first DRAM device. The first DRAM device can store the first value in a mode register. In another embodiment, processing logic determines, based on the loopback signals for a first DRAM device, a first timing offset between a first clock edge and a CA sampling point and between the first clock edge and a chip select (CS) sampling point at the first DRAM device. Processing logic sends a first value representative of the first timing offset to the first DRAM device. The first DRAM device can store the first value in a mode register.

As described herein, due to the multi-destination nature of some types of busses, such as a DDR5 backside bus from the RCD to multiple DRAMs, there are reflections on the bus that makes the eye opening different for different DRAM devices and for different bus bits. By adding a skew trim at the receiver side, there can be a timing issue between the receiver and an internal clock of subsequent logic after the receiver.

Aspects of the present disclosure overcome the timing issue by providing per-bit trim at the receivers. Aspects of the present disclosure can apply a programmable amount of skew on each of the individual clock signals to each of the receivers and apply a delay to an output of each of the receivers as described below with respect to FIGS. 10-12. For example, if a delay on a clock signal is a first delay value, $\Delta t1$, and a delay on an output receiver signal at a receiver output is a second delay value, $\Delta t2$, then the approach is to make sure a combined delay of the first delay value and the second delay value, $\Delta t1 + \Delta t2$, is equal to an offset between an earliest bit (left-most eye center) and a latest bit (right-most eye center) such that a receiver's clock signal is aligned to an input eye center while maintaining a constant delay/eye at the receiver output. In at least one embodiment, delay settings are generating using an algorithm, such as the one set forth in FIG. 10.

FIG. 10 is a flow diagram of a method 1000 for programming a delay circuit of a DRAM device, according to an embodiment. The method 1000 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 1000 is performed by memory controller 102, as shown in FIG. 1. In another embodiment, the method 1000 is performed by a command buffer 826, as shown in FIG. 8.

Referring to FIG. 10, at block 1002, method 1000 begins by processing logic determining a center of an eye opening for each input bit with a clock delay at a minimum setting. The clock delay at the minimum setting allows the input eye center for each of the input bits to be found. Processing logic determines a time difference between an earliest input bit and a latest input bit based on the centers of the eye openings (block 1004). For example, the earliest input bit is the left-most eye center and the latest input bit is the right-most eye center between all the eye centers. It can be assumed that the left-most eye center is bit "e" and the right-most eye center is bit "n" and one or more bits' "m" eye center is between "e" and "n." Processing logic determines a first delay value for each of the input clock signals to the receivers and a second delay value for each of the output receiver signals (block 1006). Assuming the time difference between eye centers of bit "n" and bit "e" is a time difference of $\Delta tn$, then the time difference between any of the one or more bits "m" and bit "e" is Atm. Then for the earliest bit "e," a first delay value of zero ($\Delta t=0$) on an input clock signal (Rx clock) and a second delay value equal to the time difference, $\Delta tn$, at the receiver output, are added to the respective receiver. This is because the earliest bit "e" is the left-most eye center or earliest eye center and requires no delay on the input clock signal (Rx clock), but requires a delay equal to the delay seen for bit "n" at the Rx output. Then for the latest bit "n," a first delay value equal to the time difference, $\Delta t=n$, on an input clock signal (Rx clock) and a second delay value of zero ($\Delta t=0$), at the receiver output, are added to the respective receiver. This is because the latest bit "n" is the right-most eye center or latest eye center and requires a delay on the input clock signal (Rx clock), but requires no delay at the Rx output. For an intermediate bit "m", a first delay value equal to $\Delta t=m$ on Rx clock and a second delay value equal to $\Delta t=\Delta tn - \Delta tm$ at the Rx output are added. This is because the intermediate bit "m" sits in between bit "e" and bit "n" eye centers, and as such Rx clock requires a delay that is the difference between the bit "e" eye center and delay of its own input eye center. The difference in delay between its input eye center and the latest bit "n" then must be added to the output of the Rx.

Referring back to FIG. 10, the processing logic programs each receiver of a DRAM device with the first offset value for an input clock signal and the second delay value for an output receiver signal to allow a timing adjustment to be made between a clock edge of a clock signal and a sampling point at the respective bit (block 1008); and the method 1000 ends.

Figure 11:
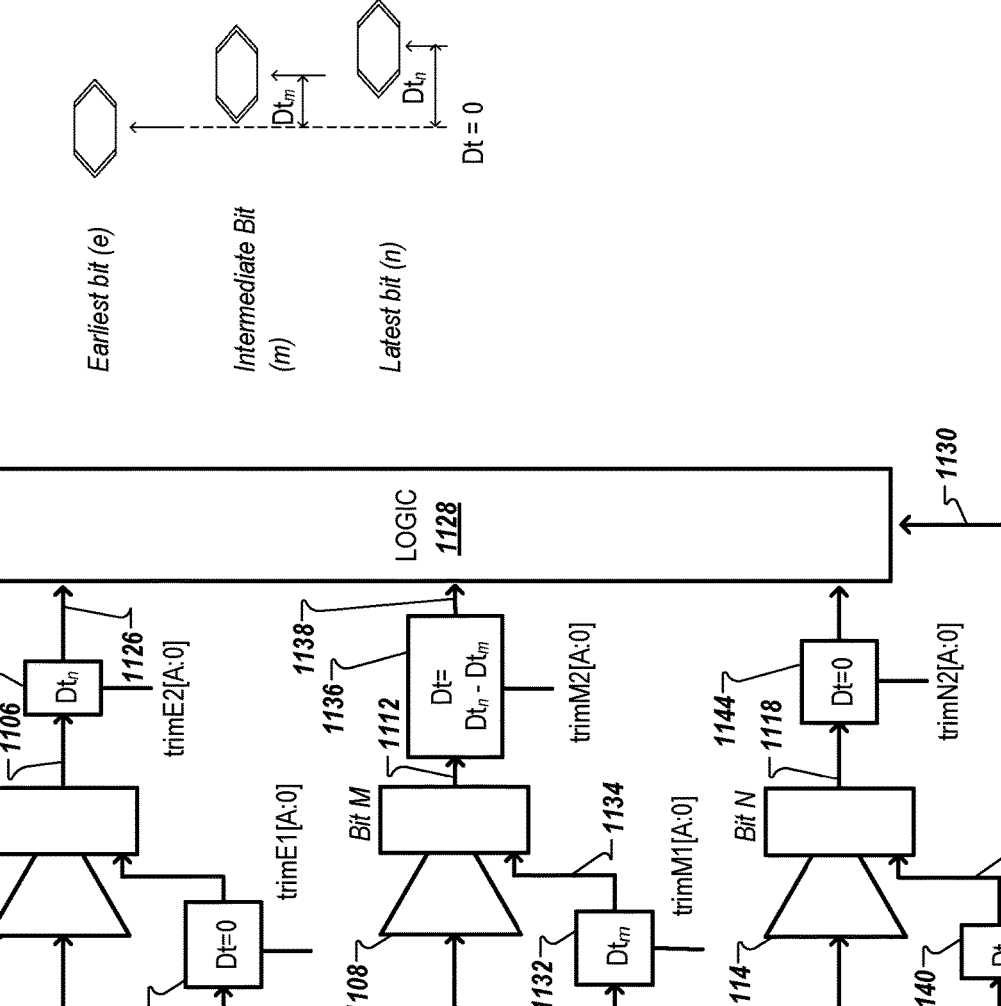
FIG. 11 is a schematic diagram of three receivers and delay elements that can be individual programmed to provide a per-bit trim at the three receivers according to at least one embodiment.

The approach of method 1000 is further illustrated with an example of three receivers for three bits in FIG. 11.

FIG. 11 is a schematic diagram of three receivers and delay elements that can be individually programmed to provide a per-bit trim at the three receivers according to at least one embodiment. A first receiver 1102 receives a first input signal 1104 and provides a first output signal 1106. A second receiver 1108 receives a second input signal 1110 and provides a second output signal 1112. A third receiver 1114 receives a second input signal 1116 and provides a second output signal 1118. The first receiver 1102 is determined to be an earliest bit, e, the second receiver 1108 is determined to be an intermediate bit, m, and the third receiver 1114 is determined to be the latest bit, n, using method 1000 described above. As described above the time difference between the earliest bit, e, and the latest bit, n, is determined as $\Delta tn$. For the first receiver 1102, corresponding to the earliest bit "e," a first delay element 1120 is programmed with a first delay value of zero ($\Delta t=0$) on an input clock signal (Rx clock) 1122, and a second delay element 1124 is programmed with a second delay value equal to the time difference, $\Delta tn$, at the receiver output. The second delay element 1124 receives and delays the first output signal 1106 to provide a delayed output signal 1126 to logic 1128 that is clocked with an internal clock 1130. This is because the earliest bit "e" is the left-most eye center or earliest eye center and requires no delay on the input clock signal (Rx clock), but requires a delay equal to the delay seen for bit "n" at the Rx output.

For the second receiver 1108, corresponding to an intermediate bit "m", a third delay element 1132 is programmed with a first delay value equal to $Dt_m$ ($\Delta t=m$) on an input clock signal (Rx clock) 1122 and a fourth delay element

1136 is programmed with a second delay value equal to $Dt=Dt_n-Dt_m$ ($\Delta t=\Delta tn-\Delta tm$) at the receiver output. The third delay element 1132 receives and delays the input clock signal 1122 to provide a delayed clock signal 1134 to the second receiver 1108. The fourth delay element 1136 receives and delays the second output signal 1112 to provide a delayed output signal 1138 to logic 1128 that is clocked with the internal clock 1130. This is because the intermediate bit "m" sits in between bit "e" and bit "n" eye centers, and as such Rx clock requires a delay that is the difference between the bit "e" eye center and delay of its own input eye center. The difference in delay between its input eye center and the latest bit "n" then must be added to the output of the Rx.

For the third receiver 1114, corresponding to the latest bit "n," a fifth delay element 1140 is programmed with a first delay value equal to the time difference, $\Delta t=n$, and a sixth delay element 1144 with a second delay value of zero ($\Delta t=0$) at the receiver output. The fifth delay element 1140 receives and delays the input clock signal 1122 to provide a delayed clock signal 1142 to the third receiver 1114. This is because the latest bit "n" is the right-most eye center or latest eye center and requires a delay on the input clock signal (Rx clock), but requires no delay at the Rx output.

Figure 12:
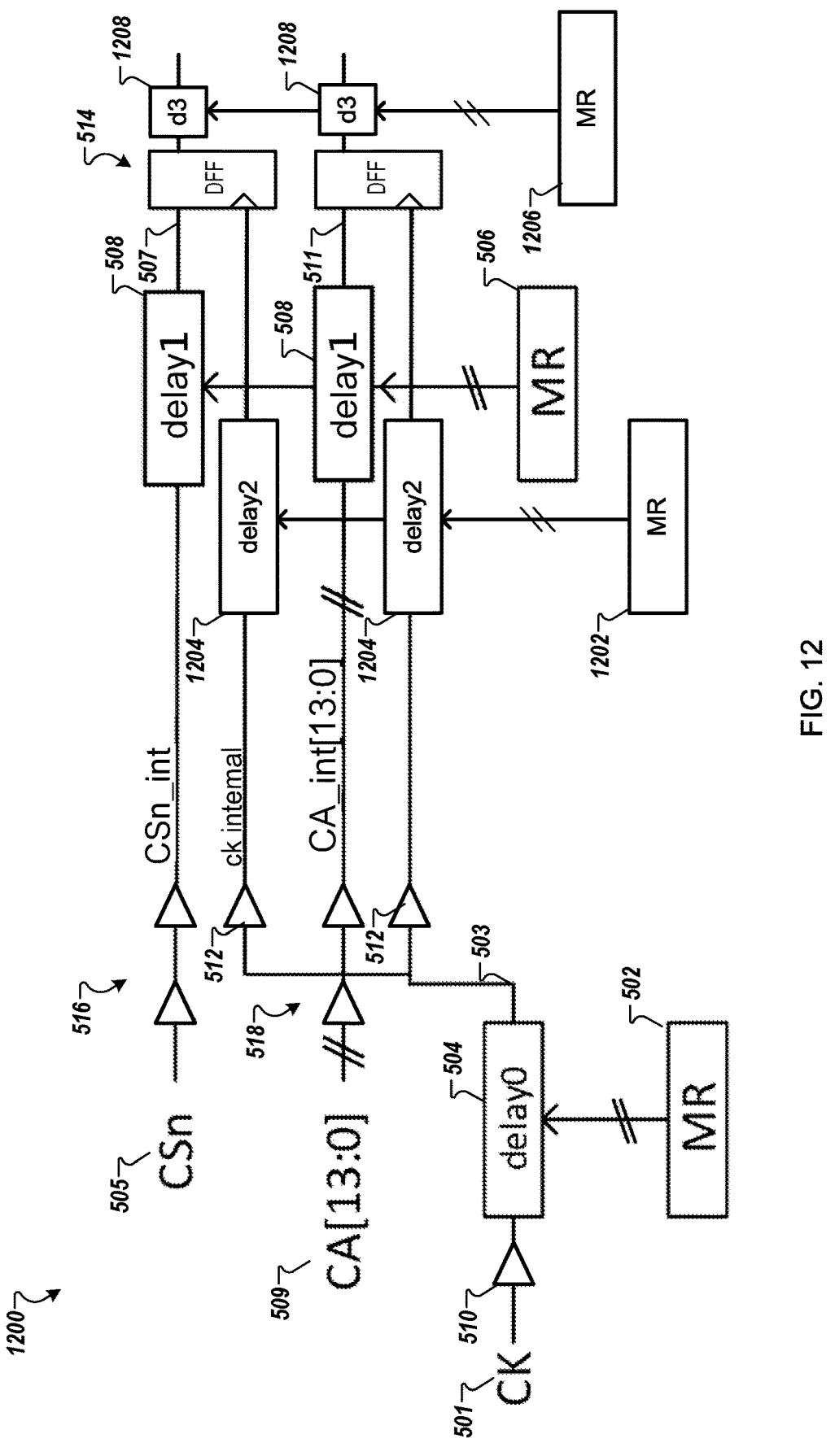
FIG. 12 is a block diagram illustrating a DRAM CA interface with programmable delays between a clock signal and CA/CS signals according to an embodiment.

FIG. 12 is a block diagram illustrating a DRAM CA interface 1200 with programmable delays between a clock signal and CA/CS signals according to an embodiment. DRAM CA interface 1200 is similar to DRAM CA interface 500 as noted by similar reference numbers, except DRAM CA interface 1200 additionally includes a third mode register 1202, a second set of delay elements 1204 (delay2), a fourth mode register 1206, and a third set of delay elements 1208. The second set of delay elements 1204 can be individually controlled by corresponding values stored in the third mode register 1202. Each of the second set of delay elements 1204 delays a clock signal 503 by a respective programmable delay corresponding to a respective value in the third mode register 1202. In one embodiment, the values stored in the third mode register 1202 and the fourth mode register 1206 correspond to the first delay values and the second delay values, respectively, as described above with respect to FIGS. 10-11.

In one embodiment, the approach described above with respect to FIGS. 10-12 can be used at the RCD-CPU interface and/or RCD-Memory interface (RDIMM/LRDIMM), CPU-Memory Address (UDIMM), and RCD-DB interface (LRDIMM).

Although the operations of the methods herein are shown and described in a particular order, the order of the operations of each method may be altered so that certain operations may be performed in an inverse order or so that certain operations may be performed, at least in part, concurrently with other operations. In certain implementations, instructions or sub-operations of distinct operations may be in an intermittent and/or alternating manner.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

In the above description, numerous details are set forth. It will be apparent, however, to one skilled in the art, that the aspects of the present disclosure may be practiced without these specific details. In some instances, well-known structures and devices are shown in block diagram form, rather than in detail, in order to avoid obscuring the present disclosure.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving," "determining," "selecting," "storing," "setting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general-purpose computer selectively activated or reconfigured by a computer program stored in the computer. Such a computer program may be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear as set forth in the description. In addition, aspects of the present disclosure are not described with reference to any particular programming language. It will be appreciated that a variety of programming languages may be used to implement the teachings of the present disclosure as described herein.

Aspects of the present disclosure may be provided as a computer program product, or software, that may include a machine-readable medium having stored thereon instructions, which may be used to program a computer system (or other electronic devices) to perform a process according to the present disclosure. A machine-readable medium includes any procedure for storing or transmitting information in a form readable by a machine (e.g., a computer). For example, a machine-readable (e.g., computer-readable) medium includes a machine (e.g., a computer) readable storage medium (e.g., read-only memory ("ROM"), random access memory ("RAM"), magnetic disk storage media, optical storage media, flash memory devices, etc.).

What is claimed is:

1. An integrated circuit memory device comprising:

a first interface configured to receive command/address (CA) signals and a clock signal, the first interface having a receiver for each of the CA signals;

a data interface, wherein the first interface, in a CA bus loopback mode, is configured to receive a pattern of CA signals and the data interface, in the CA bus loopback mode, is configured to output the received pattern of CA signals;

a mode register configured to store values representative of a timing offset between the clock signal and a sampling point for the first interface, wherein the values include a first value and a second value;

a first delay element controlled by the first value stored in the mode register to delay a clock edge by a first programmable delay; and a plurality of delay elements, wherein each delay element is controlled by the second value stored in the mode register to delay a sampling point for each receiver of the first interface, for each corresponding CA signal, by a second programmable delay.

2. The integrated circuit memory device of claim 1, further comprising:

a programmable delay line coupled between a clock terminal and a clock buffer, the programmable delay line comprising the first delay element and a second delay element; and a delay locked loop (DLL) circuit, wherein the DLL circuit is configured to control a programmable delay of the programmable delay line using the first delay element and the second delay element.

3. The integrated circuit memory device of claim 1, further comprising:

a first plurality of delay elements, wherein the first plurality of delay elements is controlled by a first set of values stored in the mode register to delay a receiver of each clock line corresponding to each CA bit by a first set of programmable delays; and a second plurality of delay elements, wherein the second plurality of delay elements is controlled by a second set of values stored in the mode register to delay a receiver of each CA bit by a second set of programmable delays.

4. The integrated circuit memory device of claim 1, further comprising:

a first CA line of a plurality of CA lines;

a clock (CK) line;

the first delay element on the CK line, wherein the first delay element is controlled by the first value stored in the mode register to delay a clock signal on the CK line by the first programmable delay; and a second delay element, of the plurality of delay elements, on the first CA line, wherein the second delay element is controlled by the second value stored in the mode register to delay a CA signal on the first CA line by the second programmable delay.

5. The integrated circuit memory device of claim 4, further comprising:

a chip select (CS) line; and a third delay element on the CS line, wherein the third delay element is controlled by the second value stored in the mode register to delay a CS signal on the CS line by the second programmable delay.

6. The integrated circuit memory device of claim 4, further comprising:

a second CA line of the plurality of CA lines; and a fourth delay element on the second CA line, wherein the fourth delay element is controlled by the second value stored in the mode register to delay a second CA signal on the second CA line by the second programmable delay.

7. The integrated circuit memory device of claim 4, further comprising:

a second CA line of the plurality of CA lines; and a fourth delay element on the second CA line, wherein the fourth delay element is controlled by a third value stored in the mode register to delay a second CA signal on the second CA line by a third programmable delay.

* * * * *